United States Patent
Pierson, Jr. et al.

(10) Patent No.: US 6,800,531 B2
(45) Date of Patent: Oct. 5, 2004

(54) METHOD OF FABRICATING A BIPOLAR TRANSISTOR

(75) Inventors: Richard L. Pierson, Jr., Thousand Oaks, CA (US); James Chingwei Li, Thousand Oaks, CA (US); Berinder P. S. Brar, Newbury Park, CA (US); John A. Higgins, Westlake Village, CA (US)

(73) Assignee: Rockwell Scientific Licensing, LLC, Thousand Oaks, CA (US)

(*) Notice: Subject to any disclaimer, the term of this patent is extended or adjusted under 35 U.S.C. 154(b) by 0 days.

(21) Appl. No.: 10/353,208

(22) Filed: Jan. 27, 2003

(65) Prior Publication Data

US 2003/0197193 A1 Oct. 23, 2003

Related U.S. Application Data

(62) Division of application No. 10/075,428, filed on Feb. 14, 2002.

(51) Int. Cl.[7] .................. H01L 21/331; H01L 21/8222
(52) U.S. Cl. .................. 438/312; 438/313; 438/327
(58) Field of Search .................. 438/309, 312–313, 438/315, 317, 327, 235

(56) References Cited

U.S. PATENT DOCUMENTS

| 5,041,882 A | 8/1991 | Katoh .................. 357/16 |
| 6,376,867 B1 | 4/2002 | Gutierrez-Aitken et al. 257/197 |
| 6,403,436 B1 * | 6/2002 | Tanomura .................. 438/312 |
| 6,406,965 B1 | 6/2002 | Lammert .................. 438/312 |
| 6,583,455 B1 * | 6/2003 | Micovic et al. .............. 257/200 |
| 2001/0015474 A1 | 8/2001 | Blayac et al. ............... 257/565 |

* cited by examiner

*Primary Examiner*—Phat X. Cao
*Assistant Examiner*—Theresa T. Doan
(74) *Attorney, Agent, or Firm*—Koppel, Jacobs, Patrick & Heybl

(57) ABSTRACT

A thin InGaAs contact layer is provided for the collector of a heterojunction bipolar transistor (HBT) above an InP sub-collector. The contact layer provides a low resistance contact mechanism and a high thermal conductivity path for removing device heat though the sub-collector, and also serves as an etch stop to protect the sub-collector during device fabrication. A portion of the sub-collector lateral to the remainder of the HBT is rendered electrically insulative, preferably by an ion implant, to provide electrical isolation for the device and improve its planarity by avoiding etching through the sub-collector.

6 Claims, 6 Drawing Sheets

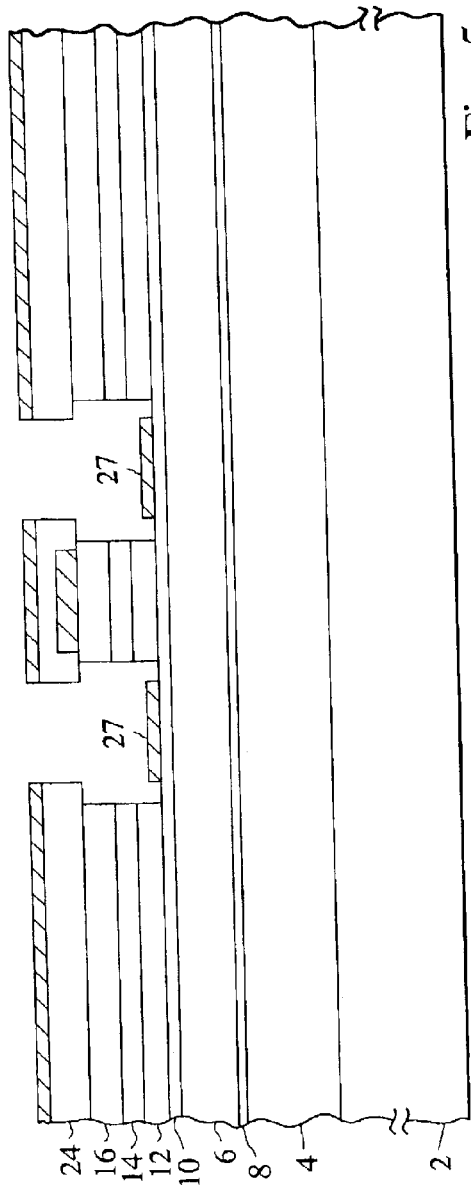
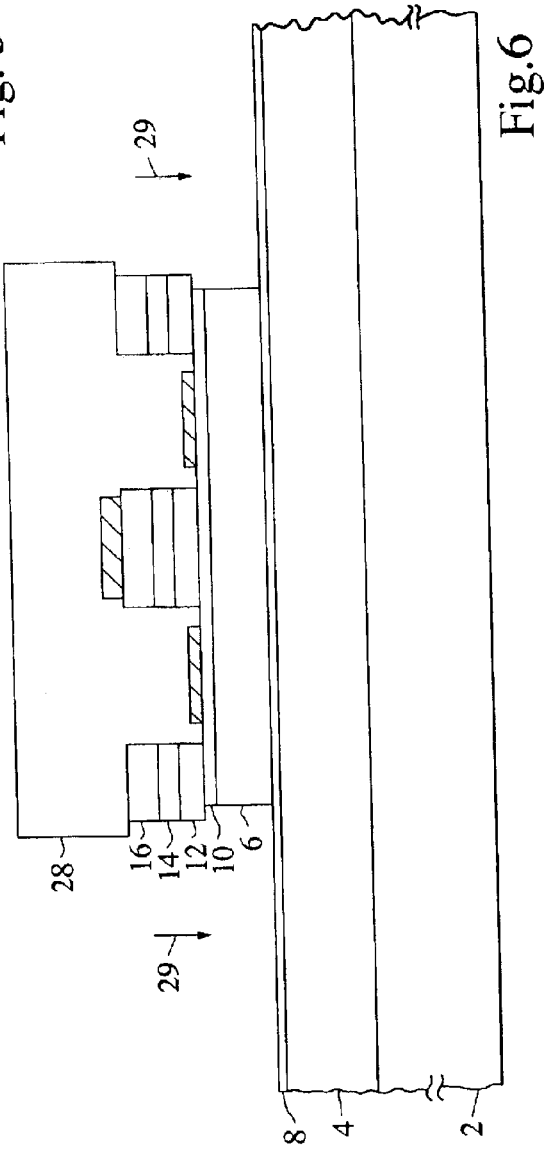

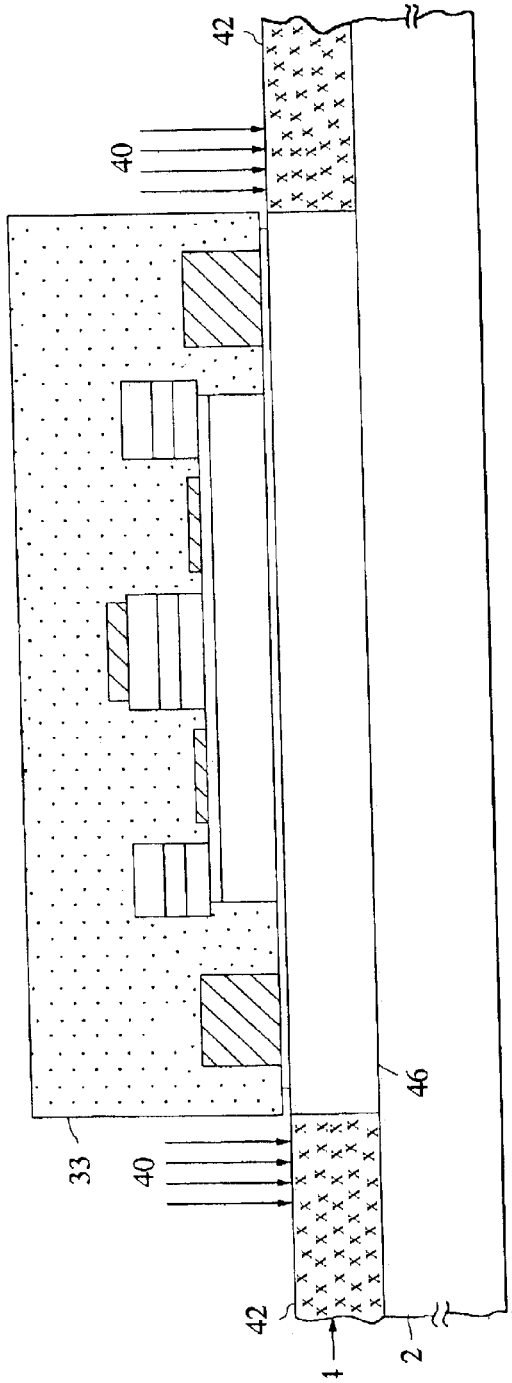
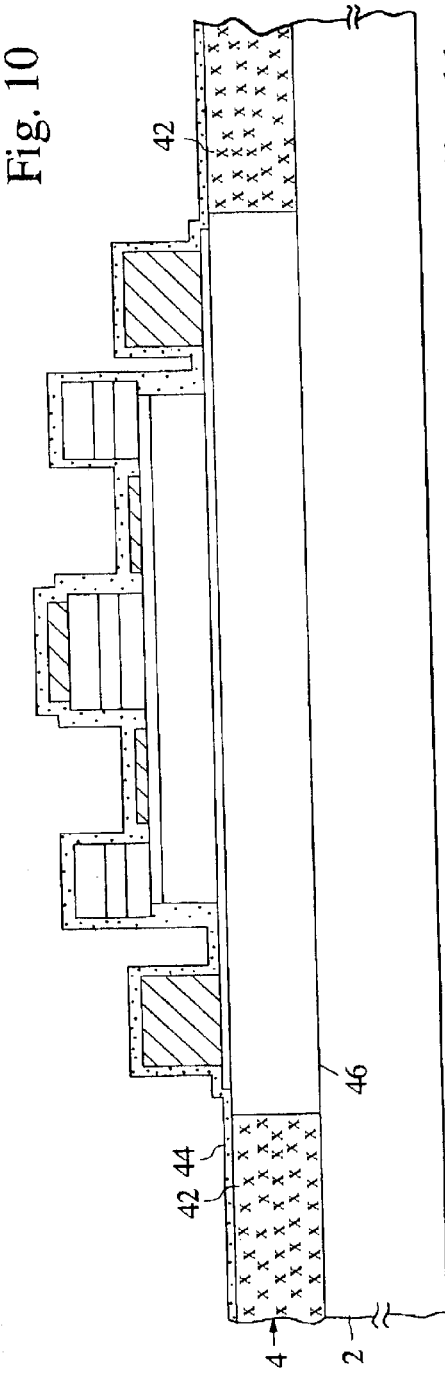

METHOD OF FABRICATING A BIPOLAR TRANSISTOR

RELATED APPLICATION

This application is a divisional of application Ser. No. 10/075,428, filed Feb. 14, 2002 for Heterojunction Bipolar Transistor With InGaAs Contact And Etch Stop Layer For InP Sub-Collector.

BACKGROUND OF THE INVENTION

1. Field of the Invention

This invention relates to Indium Phosphide based heterojunction bipolar transistors (HBTs), and more particularly to high power HBTs with an InP sub-collector.

2. Description of the Related Art

HBTs are described in general in Wang, "Introduction to Semiconductor Technology: GaAs and Related Compounds", John Wiley & Sons, 1990, pp. 170–230. Various material families have been employed for such devices. See, for example, the article "AlGaAs/GaAs HBTs for Analog and Digital Applications" in Chang, ed., "Current Trends in Heterojunction Bipolar Transistors", World Scientific Publishing Co. Pte. Ltd., 1996, pp. 59–98.

For InP substrates, HBTs have used an InP emitter, InGaAs base, and either an InGaAs collector and sub-collector, with the sub-collector heavily doped N+ to function as a contact for the collector, or an InP collector with either a heavily doped InGaAs or an InP sub-collector. The first device, with the InGaAs collector, is referred to as a single HBT (SHBT) because it has only one interface between materials with differing bandgaps. (This interface is called the InP/InGaAs emitter-base "hetero-junction"). The second device is called a double HBT (DHBT) because it has two hetero-junctions (the InP/InGaAs emitter-base junction and the InGaAs/InP base-collector junction). The SHBT is generally easier to fabricate but has a relatively low breakdown voltage and a limited power dissipation capacity, thus restricting its use to relatively low power applications. While more difficult to fabricate, the DHBT has a higher breakdown voltage and its InP collector has a thermal conductivity of about 0.7W/cm° C., or approximately seven times that of InGaAs. Thus, DHBTs can be used for high power applications. However, whereas the specific contact resistance between a metal contact and the InGaAs sub-collector in a SHBT is quite low, it is difficult to establish a low resistance contact from a metal to the InP sub-collector of a DHBT due to the alignment of the InP bandgap.

SUMMARY OF THE INVENTION

The present invention seeks to provide an HBT which has an inherently low metal contact resistance to the sub-collector, a sub-collector with good thermal conductivity, and improved fabrication and electrical isolation techniques for such devices.

These goals are achieved by fabricating an HBT with a thick InP sub-collector and a thin, low resistance InGaAs "contact" layer placed between the InP collector and the InP sub-collector layers. The InGaAs contact layer provides a low resistance contact to metal, but is thin enough (not thicker than about 500 Angstroms and preferably about 100–200 Angstroms) so that it permits a high degree of thermal conduction from the collector to the sub-collector, thereby allowing for higher power dissipation from the device.

The substance of the invention (an improved InP sub-collector system consisting of a thin InGaAs n+ layer on a thicker InP n+ layer) is also useful for SHBTs. Although power dissipated in a SHBT is low, device junction temperatures would rise to intolerable high levels if a simple sub-collector of a single InGaAs thick layer were used. The thermal conductivity of InGaAs is too low.

The addition of an InGaAs contact layer offers a fabrication benefit for DHBTs, in that it can be used as an etch stop to protect the sub-collector when the collector layer of the HBT is etched to a desired geometry. A more planar device can also be achieved by rendering the InP sub-collector area surrounding the transistor electrically insulating, preferably by an ion implant, thereby avoiding the need to etch that sub-collector area away to achieve device isolation.

These and other features and advantages of the invention will be apparent to those skilled in the art from the following detailed description, taken together with the accompanying drawings.

BRIEF DESCRIPTION OF THE DRAWINGS

FIGS. 3–9 are sectional views of the DHBT illustrated in FIG. 1 at successive stages of fabrication;

FIGS. 10 and 11 are sectional views of the DHBT illustrated in FIG. 1, showing an ion implant isolation technique.

DETAILED DESCRIPTION OF THE INVENTION

Figure 1:
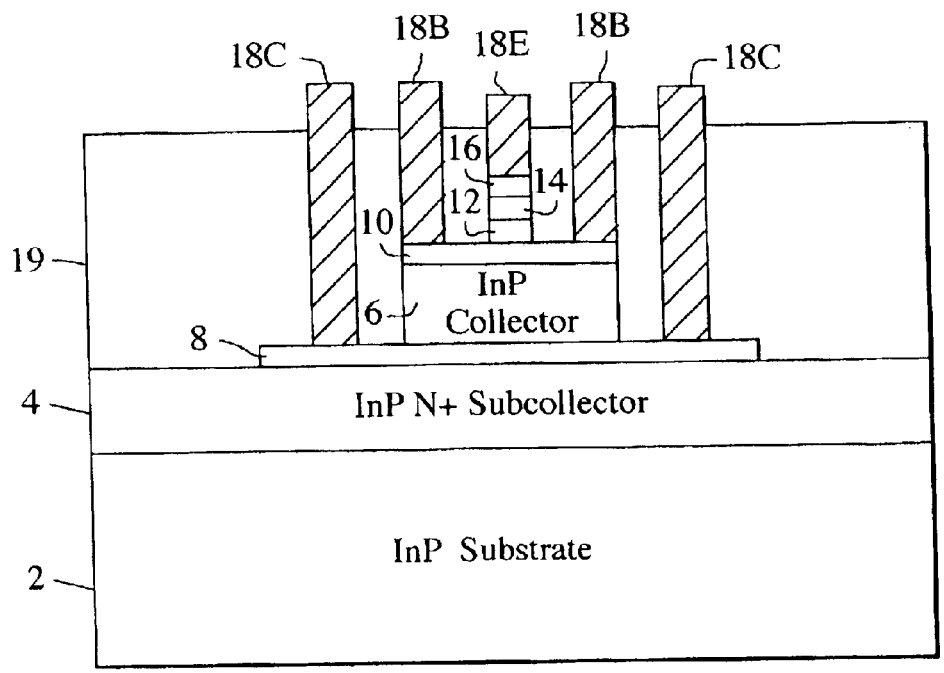
FIGS. 1 and 2 are sectional views (not to scale) illustrating a DHBT and an SHBT, respectively, fabricated in accordance with the invention.

FIG. 1 illustrates a DHBT which, except for the addition of an InGaAs contact layer discussed below, is conventional in design. It is formed on an electrically semi-insulating InP substrate 2 which supports an InP sub-collector 4 that is heavily doped N+ so that it is substantially conductive. The sub-collector 4 is typically about 0.5–1 micron thick, with a dopant concentration of about $10^{19}/cm^3$. The purpose of the sub-collector is to establish an electrical contact with the collector 6, which normally directly contacts the upper central surface of the sub-collector. The collector is typically about 0.3–0.7 microns thick, with a dopant concentration of about $10^{16}$–$10^{7}/cm^3$.

In accordance with the invention, a thin InGaAs contact layer 8 is inserted between the sub-collector 4 and collector 6. The contact layer 8 is heavily doped N+, preferably to a dopant concentration of at least $10^{19}/cm^3$, thereby making it essentially a conductor with good contact properties. At the same time, it is sufficiently thin to allow for a good thermal transfer from the collector 6 to the sub-collector 4, thereby allowing dissipated power (heat) to be removed from the device by a vertical thermal transfer to the high thermal conductivity InP sub-collector and substrate. For this purpose the thickness of the contact layer 8 is no greater than about 500 Angstroms, and is preferably within the approximate range of 100–200 Angstroms. This range allows for a reliable fabrication of the contact layer using conventional growth techniques, such as molecular beam epitaxy (MBE) or metal oxide chemical vapor deposition (MOCVD), while offering a lower resistance to thermal transfer between the collector and sub-collector than bulk InGaAs. A heavily doped sub-collector is still needed because the contact layer is too thin to be adequately conductive in the horizontal plane. The contact layer 8 is preferably $In_{0.53}Ga_{0.47}As$ for lattice matching to the InP sub-collector 4.

The remainder of the DHBT is conventional, including a heavily doped InGaAs base 10 on the collector 6, typically about 300 to 1000 Angstroms thick and carbon doped p++ to a concentration of about $5 \times 10^{19}/cm^3$, and an InP emitter 12 on the base 10, typically about 400 to 2000 Angstroms thick and N doped to a concentration of about $3 \times 10^{17}/cm^3$. The emitter could alternately be formed from InAlAs. The emitter is surmounted by an (InP) emitter spacer 14 and an InGaAs emitter cap 16, both of which are N doped to a concentration of about $10^{19}/cm^3$ and are typically about 500 Angstroms and 200 Angstroms thick, respectively. Metalized contacts 18E, 18B and 18C are provided for the emitter, base and collector, respectively. In this case, however, the collector contacts are made to the new contact layer 8, rather than to the sub-collector 4. A polymer or inorganic dielectric layer 19 overlies the DHBT with the metal contacts, which connect the device to its circuit environment, extending through the dielectric layer to the DHBT. The metallization layers of the circuit environment consist of traces that run along the upper dielectric surface to the vertical contacts; two or three levels of metallization layers with intervening dielectric layers (not illustrated) that allow for lead crossovers are typical.

Figure 2:
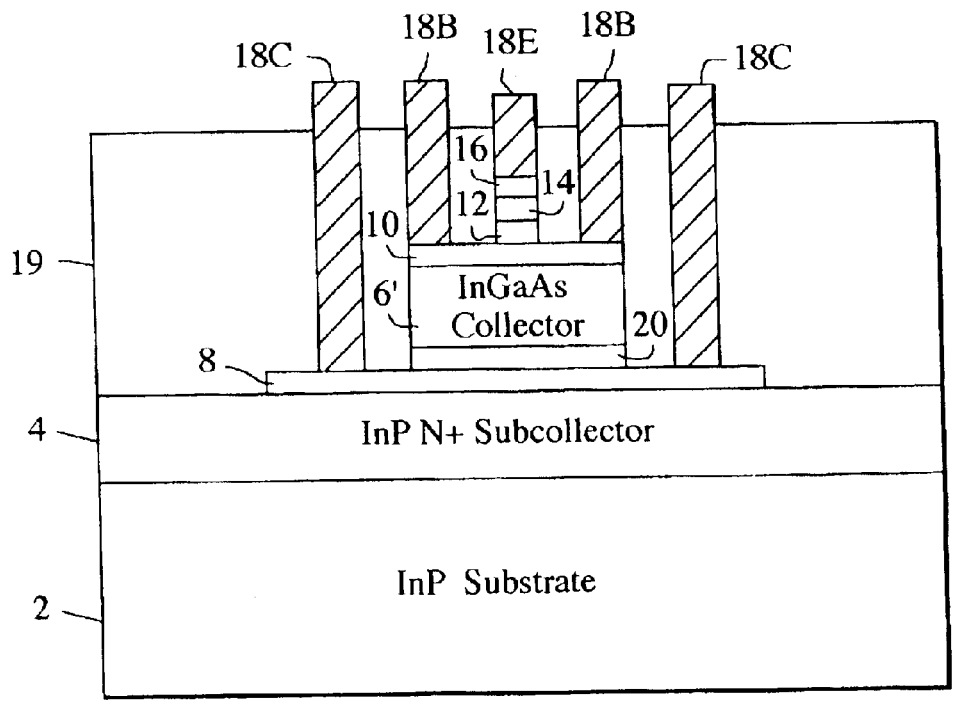

The invention is also applicable to SHBTs. Such an SHBT is illustrated in FIG. 2. The substrate 2, sub-collector 4, InGaAs contact layer 8, base 10, emitter 12, emitter spacer 14 and emitter cap 16 and dielectric 19 are essentially the same as in the DHBT of FIG. 1 and are indicated by the same reference numbers, as are the metal contacts 18E, 18B and 18C. Contrary to prior SHBTs in which the sub-collector was InGaAs, the sub-collector 4 in this device is InP, the same as in the DHBT, while its collector 6' is InGaAs as in prior SHBTs. In this device a thin, heavily doped InP etch stop layer 20 is formed between the contact layer 8 and collector 6'. In the collector etch stages of fabrication the InP etch stop layer 20 extends fully over the InGaAs contact layer 8 to protect the contact layer while the InGaAs collector 6' is being etched, and is then itself etched by an InP selective etchant so that its edges are aligned with the device's collector and base.

Figure 3:
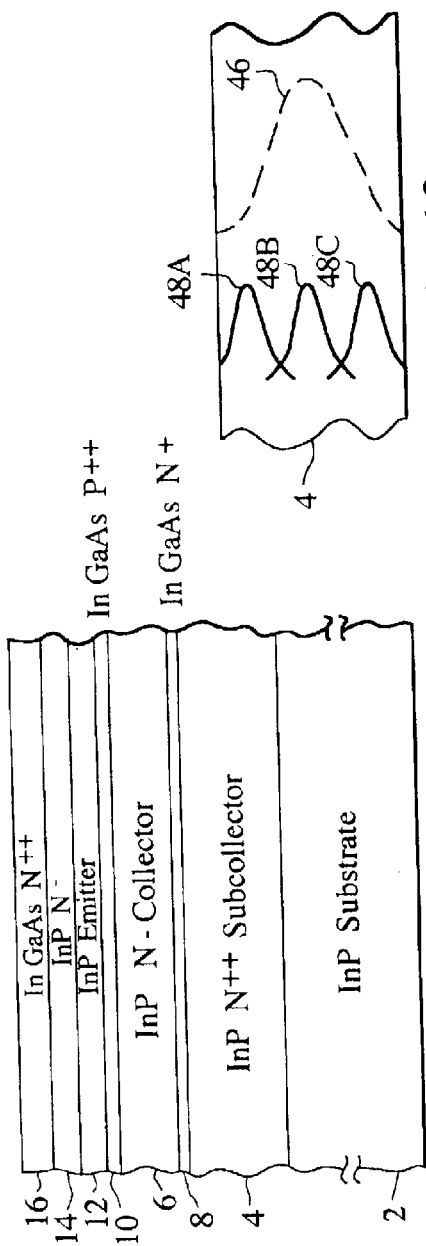
Figure 4:
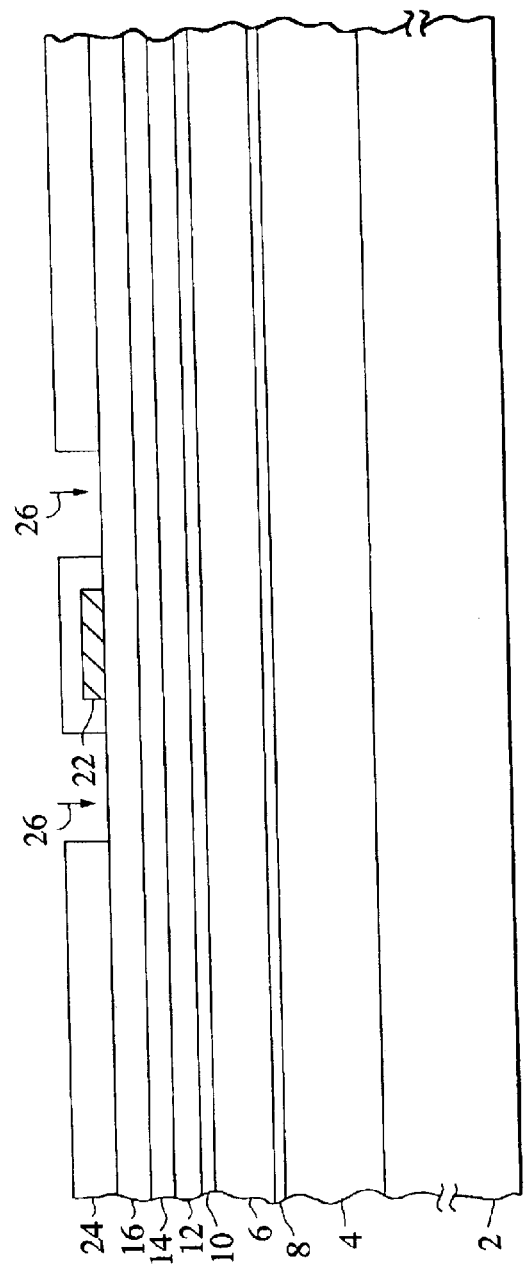

All of the material layers in the DHBT in an initial stage of fabrication extend laterally across the full device region, as illustrated in FIG. 3. Although not shown in these figures, the substrate 2 would extend beyond the individual device region shown and would typically support numerous other devices.

The patterning of the DHBT from the initial growth of FIG. 3 is illustrated in FIGS. 4–9. The first stage of the process is the "emitter etch". All of the transistor layers from the base layer 10 upwards are patterned to define lateral dimensions of the emitter 12 by consecutive etch steps that remove lateral portions of the InGaAs emitter cap 16, InP emitter spacer 14 and emitter 12.

After first forming an emitter contact 22, a patterned layer of photoresist 24 is deposited on the upper surface of the emitter cap 16 to establish the lateral dimensions for the underlying stack. Specifically, the emitter cap 16 would first be etched (as indicated by arrows 26) with an etchant selective for InGaAs, with the emitter spacer 14 and emitter 12 next etched with an etchant selective for InP. Base metal 27 is next deposited to contact the base layer 10, as illustrated in FIG. 5, and the photoresist 24 and overlying base metal are lifted off.

Figure 7:
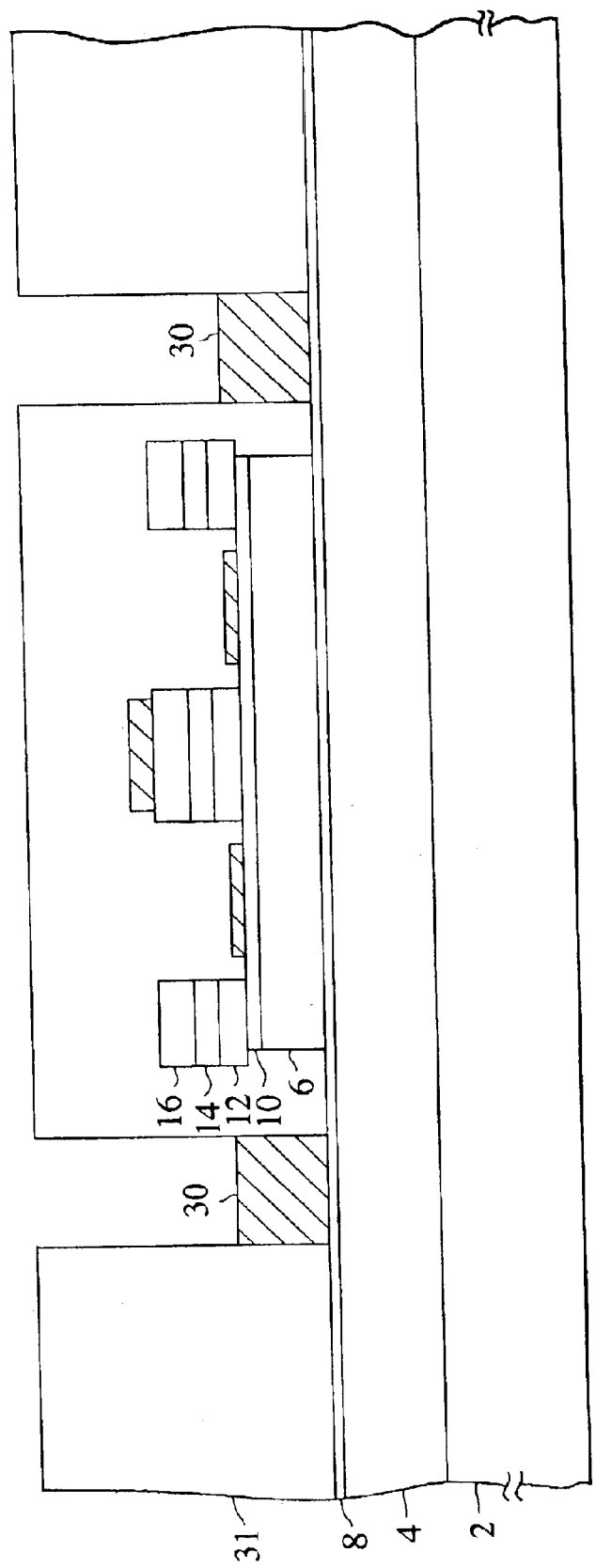

The next step in the process is the "base pedestal etch". As illustrated in FIG. 6, the width and length of the base-collector junctions 10/6 are defined by a photoresist layer 28. Following that the base and collector layers outside this intrinsic device area are etched away, as indicated by arrows 29, again by an InGaAs etch followed by an InP etch. The now exposed layer 8 is the "contact layer" of the invention. Collector metal contacts 30 are next deposited on the contact layer as illustrated in FIG. 7, through openings in a further patterned photoresist layer 31, which is laid down after first lifting off photoresist layer 28.

Figure 8:
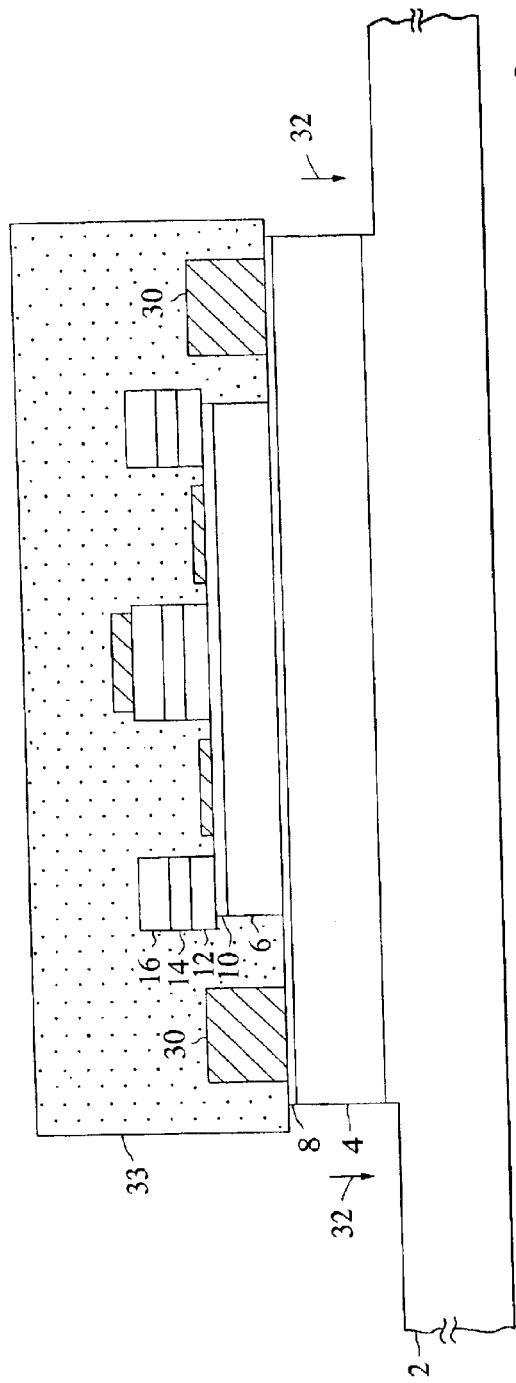

In the next step of fabrication, illustrated in FIG. 8, the sub-collector 4 area is defined. The contact layer 8 is patterned by etching with an InGaAs selective etchant (indicated by arrows 32), with a photoresist 33 protecting an area of the contact layer that is lateral to the collector 6 and includes the collector metal 30. The contact layer 8 beyond the photoresist is removed by the etchant. After patterning, the collector and base dimensions are typically about 10×20 microns, and the contact layer about 20×25 microns. The photoresist 33 is then lifted off and a protective layer 34, typically SiN, deposited over the entire device as illustrated in FIG. 9, with openings (not shown) etched in the protective layer 34 to access the base, collector and emitter contacts.

Figure 9:
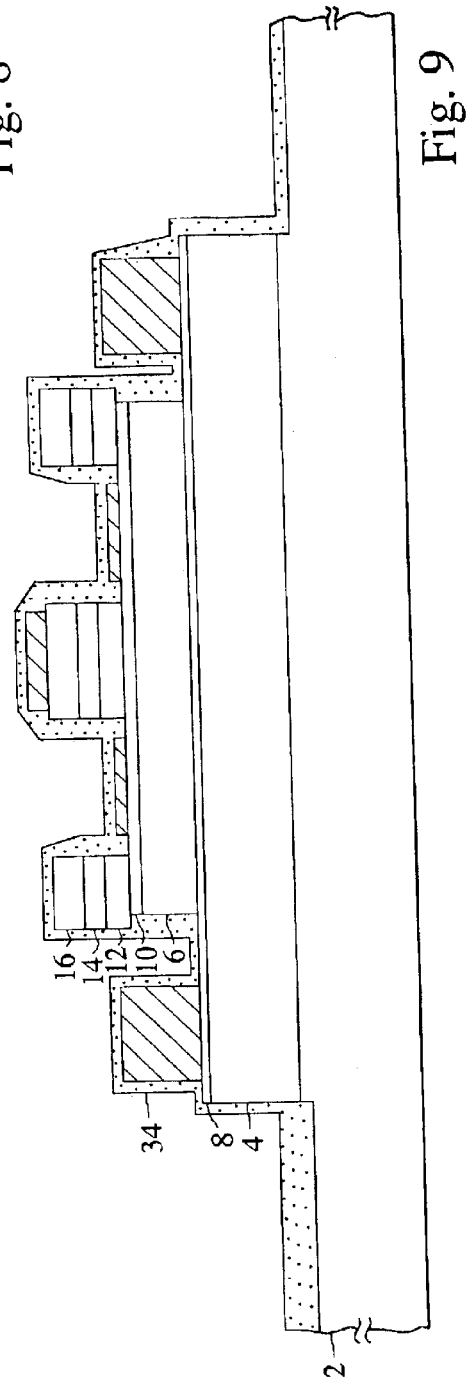

A portion of the sub-collector 4 surrounding the remainder of the DHBT would normally also be etched away, as shown in FIG. 9, to provide electrical isolation for the device. However, this step can be eliminated in accordance with one embodiment of the invention, thereby improving the device's planarity, by leaving the sub-collector intact but rendering the portion that would otherwise be removed electrically insulating. This is preferably accomplished with an ion implantation dose (indicated in FIG. 10 by arrows 40). The device is then coated with a protective layer 44, typically SiN, as illustrated in FIG. 11. The damage induced by the implanted ions traps available electrons, thus producing an insulating region 42 surrounding the DHBT, lateral to the collector layer 6 and outside the area of the remaining functional sub-collector portion 46, which is aligned with the collector layer 10. Any implant ion that has a sufficient range of available accelerator energies and which is not a shallow donor may be used.

Figure 12:
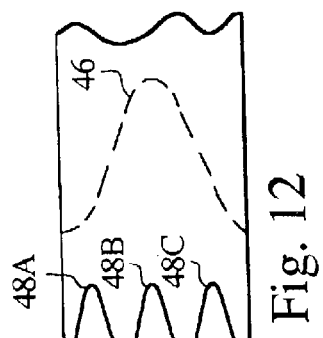
FIG. 12 is a sectional view illustrating a sub-collector ion implant profile that can be employed to electrically isolate the HBT.

Since the density of the implant damage follows a generally Gaussian (bell-shaped) profile, multiple implants are preferably performed to different ranges of acceleration energies in the sub-collector to establish a more uniform ion distribution, and accordingly a more uniform degree of insulation. For example, if hydrogen ions (protons) are employed, three different implants to principal ranges of 0.5, 0.3 and 0.1 microns, using respective acceleration energies of 500, 300 and 100 kV, could be employed. The result is illustrated in FIG. 12. Rather than a Gaussian ion distribution, illustrated by dashed curve 46 centered in the middle of the sub-collector 4, three Gaussian ion distributions 48a, 48b, 48c would be established. The overall ion distribution, representing the sum of the three implant distributions 48a, 48b, 48c, would be more uniform through the depth of the sub-collector than the single implant distribution 46. The ion implant could be performed when the sub-collector is first formed, rather than following etch patterning.

While specific embodiments of the invention have been shown and described, numerous variations and alternate embodiments are possible. For example, rather than being limited to the DHBT illustrated in FIG. 5, any bipolar transistor which employs an InP sub-collector could be electrically isolated by rendering a portion of the sub-collector electrically insulative. As another example, the HBT geometries could be varied from those illustrated herein. Accordingly, it is intended that the invention be limited only in terms of the appended claims.

We claim:

1. A method of fabricating a heterojunction bipolar transistor, comprising:

forming in succession an InP sub-collector layer, a thin electrically conductive InGaAs contact layer, and collector, base and emitter layers on a substrate, etching said collector, base and emitter layers to a desired shape, using said contact layer as an etch stop to protect said sub-collector layer when the collector layer is etched, etching at least a portion of said contact layer lateral to said collector layer after etching said collector, base and emitter layers, wherein said contact layer is etched only lateral to a lateral margin adjacent said collector layer, and forming a contact pad on said contact layer in said margin.

2. The method of claim 1, wherein said contact layer is formed with a thickness not greater than about 500 Angstroms.

3. The method of claim 2, wherein said contact layer is formed with a thickness in the approximate range of 100–200 Angstroms.

4. A method of electrically isolating a bipolar transistor, comprising:

forming said transistor with an InP sub-collector, and rendering a portion of said sub-collector electrically insulative to electrically isolate the transistor, wherein said electrically insulative portion is established by implanting ions into said sub-collector to trap conductors in the insulative portion, and said ions are implanted into the sub-collector in multiple implants at different respective principal implant depths to obtain a more uniform ion distribution than that resulting from a single implant.

5. The method of claim 4, wherein said ions are implanted into the sub-collector lateral to the remainder of the transistor.

6. The method of claim 4, said transistor comprising a heterojunction bipolar transistor (HBT).

* * * * *